United States Patent
Hirono

(10) Patent No.: US 9,360,515 B2
(45) Date of Patent: Jun. 7, 2016

(54) FAULT DETECTION DEVICE FOR INVERTER SYSTEM

(71) Applicant: SANDEN CORPORATION, Isesaki-shi (JP)

(72) Inventor: Daisuke Hirono, Isesaki (JP)

(73) Assignee: SANDEN CORPORATION, Gunma (JP)

( * ) Notice: Subject to any disclaimer, the term of this patent is extended or adjusted under 35 U.S.C. 154(b) by 0 days.

(21) Appl. No.: 14/359,872

(22) PCT Filed: Nov. 13, 2012

(86) PCT No.: PCT/JP2012/079388
§ 371 (c)(1),
(2) Date: May 21, 2014

(87) PCT Pub. No.: WO2013/077224
PCT Pub. Date: May 30, 2013

(65) Prior Publication Data
US 2014/0347067 A1  Nov. 27, 2014

(30) Foreign Application Priority Data

Nov. 21, 2011  (JP) .................................. 2011-254024

(51) Int. Cl.
*G01R 31/02*  (2006.01)
*H02M 1/32*  (2007.01)
(Continued)

(52) U.S. Cl.
CPC ............... *G01R 31/02* (2013.01); *G01R 31/42* (2013.01); *H02M 1/32* (2013.01); *H02P 29/024* (2013.01); *G01R 31/34* (2013.01); *H01L 2221/00* (2013.01);
(Continued)

(58) Field of Classification Search
CPC ..... H01L 21/00; H01L 2221/00; H02M 1/00; H02P 1/00; H02P 2101/00; H02P 2201/00
See application file for complete search history.

(56) References Cited

U.S. PATENT DOCUMENTS 4,475,150 A * 10/1984 D'Atre et al. .................... 363/51
2003/0076232 A1 * 4/2003 Sato et al. ...................... 340/679
(Continued)

FOREIGN PATENT DOCUMENTS

| CN | 1383245 | 12/2002 |
|---|---|---|
| CN | 101876681 | 11/2010 |

(Continued)

OTHER PUBLICATIONS

Office Action thereof dated Jun. 30, 2015 which issued in the corresponding Japanese Patent Application No. 2011-254024.

*Primary Examiner* — Huy Q Phan
*Assistant Examiner* — Temilade Rhodes-Vivour
(74) *Attorney, Agent, or Firm* — Cozen O'Connor

(57) ABSTRACT

To provide a fault detection device for an inverter system, that detects a fault in the inverter system including an inverter circuit 2 that converts DC power into AC power and a motor 5 driven thereby. When a driving start signal Sig1 of the inverter circuit 2 is input, a test voltage applying unit 20 applies a predetermined first test voltage to a current measuring unit 10 that measures current flowing in the inverter circuit 2, and it is determined whether the current measuring unit 10 has failed, based on the first test voltage. A control unit 30 applies a predetermined second test voltage to the inverter circuit 2 and the motor 5, and it is determined whether the inverter circuit 2 and a motor coil have failed, based on the second test voltage.

4 Claims, 6 Drawing Sheets

(51) Int. Cl.
  *G01R 31/42* (2006.01)
  *H02P 29/02* (2016.01)
  *H02M 1/00* (2006.01)
  *H02P 1/00* (2006.01)
  *H02P 27/06* (2006.01)
  *H02M 7/5387* (2007.01)
  *G01R 31/34* (2006.01)

(52) U.S. Cl.
  CPC .............. *H02M 1/00* (2013.01); *H02M 7/5387* (2013.01); *H02P 1/00* (2013.01); *H02P 27/06* (2013.01)

(56) References Cited

U.S. PATENT DOCUMENTS

| | | | | |
|---|---|---|---|---|
| 2003/0076233 | A1* | 4/2003 | Sato | H02M 7/00 340/679 |
| 2003/0117753 | A1 | 6/2003 | Kato et al. | |
| 2004/0024937 | A1* | 2/2004 | Duncan et al. | 710/100 |
| 2005/0047035 | A1* | 3/2005 | Vallinmaki | H02M 5/458 361/42 |
| 2007/0070667 | A1* | 3/2007 | Stancu et al. | 363/132 |
| 2008/0123226 | A1* | 5/2008 | McGinn | H02H 3/16 361/42 |
| 2009/0179655 | A1* | 7/2009 | Trenchs Magana | H02H 5/12 324/537 |

FOREIGN PATENT DOCUMENTS

| | | |
|---|---|---|
| CN | 102012471 | 4/2011 |
| JP | 8-205516 | 8/1996 |
| JP | 2001-320894 | 11/2001 |
| JP | 2010-068585 | 3/2010 |
| JP | 2010-246175 | 10/2010 |
| JP | 2011-188653 | 9/2011 |
| WO | WO 2010/137328 | 12/2010 |

* cited by examiner

FIG. 4

| IGBTs SUPPLIED WITH CURRENT | | | | | | DETECTION RESULT |
|---|---|---|---|---|---|---|
| LOWER SIDE OF U-PHASE | LOWER SIDE OF V-PHASE | LOWER SIDE OF W-PHASE | UPPER SIDE OF U-PHASE | UPPER SIDE OF V-PHASE | UPPER SIDE OF W-PHASE | |
| OVERCURRENT | | | | | | SHORT CIRCUIT ON UPPER SIDE OF U-PHASE |
| CURRENT SUPPLY | OVERCURRENT | | | | | SHORT CIRCUIT ON UPPER SIDE OF V-PHASE |
| CURRENT SUPPLY | CURRENT SUPPLY | OVERCURRENT | | | | SHORT CIRCUIT ON UPPER SIDE OF W-PHASE |
| CURRENT SUPPLY | CURRENT SUPPLY | CURRENT SUPPLY | OVERCURRENT | | | SHORT CIRCUIT ON LOWER SIDE OF U-PHASE |
| CURRENT SUPPLY | CURRENT SUPPLY | CURRENT SUPPLY | CURRENT SUPPLY | OVERCURRENT | | SHORT CIRCUIT ON LOWER SIDE OF V-PHASE |
| CURRENT SUPPLY | CURRENT SUPPLY | CURRENT SUPPLY | CURRENT SUPPLY | CURRENT SUPPLY | OVERCURRENT | SHORT CIRCUIT ON LOWER SIDE OF W-PHASE |

FIG. 5

| IGBTs SUPPLIED WITH CURRENT | | | | | | DETECTION RESULT |
|---|---|---|---|---|---|---|
| UPPER SIDE OF U-PHASE - LOWER SIDE OF V-PHASE | UPPER SIDE OF U-PHASE - LOWER SIDE OF W-PHASE | UPPER SIDE OF V-PHASE - LOWER SIDE OF U-PHASE | UPPER SIDE OF V-PHASE - LOWER SIDE OF W-PHASE | UPPER SIDE OF W-PHASE - LOWER SIDE OF U-PHASE | UPPER SIDE OF W-PHASE - LOWER SIDE OF V-PHASE | |
| CURRENT DOUBLE | CURRENT DOUBLE | NORMAL | NORMAL | CURRENT DOUBLE | NORMAL | SHORT CIRCUIT OF U-PHASE COIL |
| CURRENT DOUBLE | NORMAL | CURRENT DOUBLE | CURRENT DOUBLE | NORMAL | CURRENT DOUBLE | SHORT CIRCUIT OF V-PHASE COIL |
| NORMAL | CURRENT DOUBLE | CURRENT DOUBLE | NORMAL | CURRENT DOUBLE | CURRENT DOUBLE | SHORT CIRCUIT OF W-PHASE COIL |
| OVERCURRENT | CURRENT DOUBLE | CURRENT DOUBLE | CURRENT DOUBLE | CURRENT DOUBLE | CURRENT DOUBLE | SHORT CIRCUIT ON UPPER SIDE OF U-PHASE |
| CURRENT DOUBLE | CURRENT DOUBLE | OVERCURRENT | CURRENT DOUBLE | CURRENT DOUBLE | CURRENT DOUBLE | SHORT CIRCUIT ON LOWER SIDE OF U-PHASE |
| CURRENT DOUBLE | CURRENT DOUBLE | CURRENT DOUBLE | OVERCURRENT | CURRENT DOUBLE | CURRENT DOUBLE | SHORT CIRCUIT ON UPPER SIDE OF V-PHASE |
| CURRENT DOUBLE | OVERCURRENT | CURRENT DOUBLE | CURRENT DOUBLE | CURRENT DOUBLE | CURRENT DOUBLE | SHORT CIRCUIT ON LOWER SIDE OF V-PHASE |
| CURRENT DOUBLE | CURRENT DOUBLE | CURRENT DOUBLE | CURRENT DOUBLE | OVERCURRENT | CURRENT DOUBLE | SHORT CIRCUIT ON UPPER SIDE OF W-PHASE |
| CURRENT DOUBLE | CURRENT DOUBLE | CURRENT DOUBLE | CURRENT DOUBLE | CURRENT DOUBLE | OVERCURRENT | SHORT CIRCUIT ON LOWER SIDE OF W-PHASE |
| OVERCURRENT | CURRENT DOUBLE | OVERCURRENT | CURRENT DOUBLE | CURRENT DOUBLE | CURRENT DOUBLE | SHORT CIRCUIT BETWEEN U-PHASE AND V-PHASE |
| CURRENT DOUBLE | OVERCURRENT | CURRENT DOUBLE | CURRENT DOUBLE | OVERCURRENT | CURRENT DOUBLE | SHORT CIRCUIT BETWEEN U-PHASE AND W-PHASE |
| CURRENT DOUBLE | CURRENT DOUBLE | CURRENT DOUBLE | OVERCURRENT | CURRENT DOUBLE | OVERCURRENT | SHORT CIRCUIT BETWEEN V-PHASE AND W-PHASE |
| OVERCURRENT | OVERCURRENT | OVERCURRENT | OVERCURRENT | OVERCURRENT | OVERCURRENT | THREE-PHASE SHORT CIRCUIT |

FIG. 6

| \[IGBTs SUPPLIED WITH CURRENT\] UPPER SIDE OF U-PHASE - LOWER SIDE OF V-PHASE | UPPER SIDE OF U-PHASE - LOWER SIDE OF W-PHASE | UPPER SIDE OF V-PHASE - LOWER SIDE OF U-PHASE | UPPER SIDE OF V-PHASE - LOWER SIDE OF W-PHASE | UPPER SIDE OF W-PHASE - LOWER SIDE OF U-PHASE | UPPER SIDE OF W-PHASE - LOWER SIDE OF V-PHASE | DETECTION RESULT |
|---|---|---|---|---|---|---|
| OFF | OFF | OFF | CURRENT SUPPLY | OFF | CURRENT SUPPLY | DISCONNECTION OF U-PHASE COIL |
| OFF | OFF | CURRENT SUPPLY | CURRENT SUPPLY | CURRENT SUPPLY | CURRENT SUPPLY | DISCONNECTION ON UPPER SIDE OF U-PHASE |
| CURRENT SUPPLY | CURRENT SUPPLY | OFF | CURRENT SUPPLY | OFF | CURRENT SUPPLY | DISCONNECTION ON LOWER SIDE OF U-PHASE |
| OFF | CURRENT SUPPLY | OFF | OFF | CURRENT SUPPLY | OFF | DISCONNECTION OF V-PHASE COIL |
| OFF | CURRENT SUPPLY | OFF | OFF | CURRENT SUPPLY | OFF | DISCONNECTION ON UPPER SIDE OF V-PHASE |
| CURRENT SUPPLY | CURRENT SUPPLY | CURRENT SUPPLY | OFF | CURRENT SUPPLY | OFF | DISCONNECTION ON LOWER SIDE OF V-PHASE |
| CURRENT SUPPLY | OFF | CURRENT SUPPLY | OFF | OFF | CURRENT SUPPLY | DISCONNECTION OF W-PHASE COIL |
| CURRENT SUPPLY | OFF | CURRENT SUPPLY | OFF | OFF | CURRENT SUPPLY | DISCONNECTION ON UPPER SIDE OF W-PHASE |
| CURRENT SUPPLY | CURRENT SUPPLY | CURRENT SUPPLY | CURRENT SUPPLY | OFF | OFF | DISCONNECTION ON LOWER SIDE OF W-PHASE |

FAULT DETECTION DEVICE FOR INVERTER SYSTEM

RELATED APPLICATIONS

This is a U.S. National stage of International application No. PCT/JP2012/079388 filed on Nov. 13, 2012.

This patent application claims the priority of Japanese application no. 2011-254024 filed Nov. 21, 2011, the disclosure content of which is hereby incorporated by reference.

TECHNICAL FIELD

The present invention relates to a fault detection device that detects a fault in an inverter system that includes an inverter circuit and a motor driven by the inverter circuit, and more particularly, relates to a fault detection device for an inverter system capable of detecting a fault in a current measuring unit that measures current flowing in an inverter circuit before the start of driving of the inverter system, determining thereafter a fault in the inverter circuit and a motor coil, and being easily manufactured at low cost.

BACKGROUND ART

A conventional fault detection device for an inverter circuit includes: a current measuring unit that measures current of an inverter circuit that drives a motor; an overcurrent determination circuit that determines whether the measured current is overcurrent based on an output signal of the current measuring unit; and an inverter-output control circuit that controls an output of an inverter driving circuit that drives the inverter circuit based on an output signal of the overcurrent determination circuit. Here, current is forcibly supplied to at least one phase of a motor coil before rotationally driving the motor by the inverter circuit, the current is measured by the current measuring unit, the overcurrent determination circuit determines whether the measured current is overcurrent based on the output signal of the current measuring unit, and it is determined whether there is an abnormality based on the output signal of the overcurrent determination circuit (for an example, see Patent Document 1).

In this case, when detection of fault in the inverter circuit is performed, and if the current measuring unit has failed, it is not possible to measure the current of the inverter circuit, and consequently, it is not possible to detect the fault in the inverter circuit. Thus, it is important to detect the fault in the current measuring unit. In this regard, as another fault detection device for an inverter circuit, there is a technique in which plural current measuring units are provided to detect the fault in the current measuring units and currents measured by the respective current measuring units are compared with each other to mutually monitor the fault in the current measuring units.

CITATION LIST

Patent Document

Patent Document 1: Japanese Laid-Open Patent Application Publication No. 2001-320894

SUMMARY OF THE INVENTION

Problems to be Solved by the Invention

However, in the conventional fault detection device for the inverter circuit, it is necessary to provide the plural current measuring units to detect the fault in the current measuring units, and thus, the circuit becomes complicated and its manufacturing becomes difficult. Furthermore, since the number of components is increased, the manufacturing cost increases. Particularly, in order to measure the current based on a very small voltage drop in a shunt resistor when the shunt resistor is used in the current measuring unit, it is necessary to use an expensive amplification circuit with high accuracy, which causes increase in manufacturing cost.

Thus, in order to solve the above-described problems, an object of the invention is to provide a fault detection device for an inverter system capable of detecting a fault in a current measuring unit that measures current flowing in an inverter circuit before the start of driving of the inverter system, detecting thereafter a fault in the inverter circuit and a motor coil, and being easily manufactured at low cost.

Means for Solving the Problems

In order to achieve the above object, according to an aspect of the invention, there is provided a fault detection device for an inverter system that detects a fault in the inverter system, the inverter system including an inverter circuit that converts input DC power into AC power and a motor that is driven by the inverter circuit, in which, when a driving start signal of the inverter circuit is input, a test voltage applying unit applies a predetermined first test voltage to a current measuring unit that measures current flowing in the inverter circuit, and it is determined whether the current measuring unit has failed or not based on the applied first test voltage, and a control unit applies a predetermined second test voltage to the inverter circuit and the motor, and it is determined whether the inverter circuit and a coil of the motor have failed or not based on the applied second test voltage, so that it is determined whether the current measuring unit has failed or not before the start of driving of the inverter system, and then it is determined whether the inverter circuit and the coil of the motor have failed or not.

With this configuration, when the driving start signal of the inverter circuit is input, the predetermined first test voltage is applied to the current measuring unit, and it is determined whether the current measuring unit has failed or not based on the applied first test voltage. Then, the predetermined second test voltage is applied to the inverter circuit and the motor, and it is determined whether the inverter circuit and the coil of the motor have failed or not based on the applied second test voltage.

Furthermore, when the first test voltage amplified by an amplification circuit provided in the current measuring unit is greater than an upper limit value of a voltage range that is determined in advance based on the first test voltage or is less than a lower limit value thereof, the control unit may determine that the current measuring unit has failed.

Furthermore, when the second test voltage amplified by an amplification circuit provided in the current measuring unit is greater than an upper limit value of a voltage range that is determined in advance based on the second test voltage or is less than a lower limit value thereof, the control unit may determine that the inverter circuit and the coil of the motor have failed.

Furthermore, when a predetermined time elapses from the start of application of the second test voltage, the control unit may determine whether the inverter circuit and the coil of the motor have failed or not.

Advantageous Effects of the Invention

According to the invention relating to claim 1, it is possible to apply the predetermined first test voltage to the current measuring unit when the driving start signal of the inverter circuit is input, to determine whether the current measuring unit has failed or not based on the applied first test voltage. Then, it is possible to apply the predetermined second test voltage to the inverter circuit and the motor, to determine whether the inverter circuit and the coil of the motor have failed or not based on the applied second test voltage. Accordingly, it is possible to detect the fault in the current measuring unit before the start of driving of the inverter system. Furthermore, it is possible to detect the fault in the inverter circuit and the fault in the coil of the motor. In this case, since the number of the current measuring unit is one, the circuit can be simplified and can be easily manufactured. Furthermore, since the number of components is small, it is possible to manufacture the circuit at low cost. In particular, when a shunt resistor is used in the current measuring unit, only one expensive amplification circuit for measuring the current based on a very small voltage drop in the shunt resistor is required, and thus, it is possible to manufacture the circuit at low cost.

According to the invention relating to claim 2, even when the first test voltage amplified by the amplification circuit provided in the current measuring unit is greater than the upper limit value of the voltage range that is determined in advance or even when the amplified voltage is less than the lower limit value thereof, the control unit can perform the determination as to whether the current measuring unit has failed or not. Accordingly, it is possible to reliably detect the fault in the current measuring unit.

According to the invention relating to claim 3, even when the second test voltage amplified by the amplification circuit provided in the current measuring unit is greater than the upper limit value of the voltage range that is determined in advance or even when the amplified voltage is less than the lower limit value thereof, the control unit can perform the determination as to whether the inverter circuit and the coil of the motor have failed or not. Accordingly, it is possible to reliably detect the fault in the inverter circuit and the coil of the motor.

According to the invention relating to claim 4, when the predetermined time elapses from the start of application of the second test voltage, the control unit can determine whether the inverter circuit and the coil of the motor have failed or not. Accordingly, it is possible to accurately determine the fault in the inverter circuit and the coil of the motor.

BRIEF DESCRIPTION OF THE DRAWINGS

FIG. 4 is a table in which, with respect to IGBTs supplied with current in detection of a short circuit of the inverter circuit in FIG. 3, a current determination result and a short circuit detection result for each IGBT are collectively shown;

FIG. 5 is a table in which, with respect to pairs of IGBTs supplied with current in detection of a short circuit of the inverter circuit and a motor coil in FIG. 3, a current determination result and a short circuit detection result for each pair of IGBTs are collectively shown; and FIG. 6 is a table in which, with respect to pairs of IGBTs supplied with current in detection of disconnection of the inverter circuit and the motor coil in FIG. 3, a current supply determination result and a disconnection detection result for each pair of IGBTs are collectively shown.

REFERENCE SIGNS LIST

Figure 1:
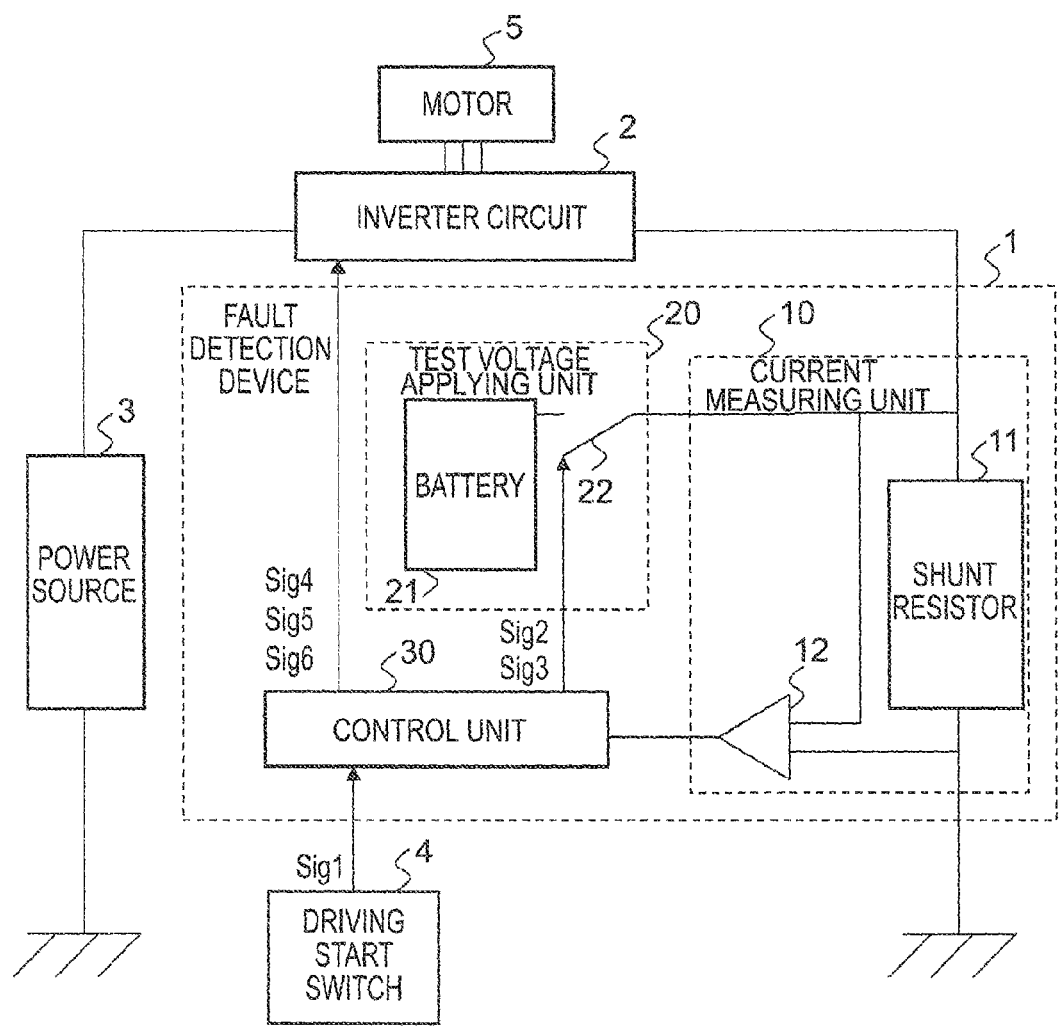
FIG. 1 is a block diagram illustrating a fault detection device for an inverter system according to an embodiment of the invention.

1 Fault detection device
2 Inverter circuit
3 Power source
4 Driving start switch
5 Motor
10 Current measuring unit
11 Shunt resistor
12 Amplification circuit
20 Test voltage applying unit
21 Battery
22 Switch
30 Control unit

MODE FOR CARRYING OUT THE INVENTION

Embodiments of the invention will now be described with reference to the accompanying drawings.

FIG. 1 is a block diagram illustrating a fault detection device for an inverter system according to an embodiment of the invention. A circuit illustrated in the block diagram of FIG. 1 represents a use state where a fault detection device 1 for an inverter system according an embodiment of the invention (hereinafter, referred to as a "fault detection device") is connected to an inverter circuit 2 that is a fault detection target, in which the inverter circuit 2, a power source 3 and a driving start switch 4 are connected to the fault detection device 1 and a motor 5 is connected to the inverter circuit 2. The inverter circuit 2 is a circuit that is used for controlling the motor 5 or the like and converts DC power supplied from the power source 3 into AC power. The power source 3 supplies the DC power to the inverter circuit 2. The driving start switch 4 is a switch for starting a driving control of the inverter circuit 2. By turning on the driving start switch 4, a driving start signal Sig1 of the inverter circuit 2 is output. The driving start switch 4 may be a manual switch or an electronic control switch.

The fault detection device 1 detects a fault in an inverter system that includes the inverter circuit 2 and the motor 5 driven by the inverter circuit 2. The fault detection device 1 is connected to the inverter circuit 2 that drives the motor 5. The fault detection device 1 includes a current measuring unit 10, a test voltage applying unit 20 and a control unit 30.

The current measuring unit 10 is connected to a ground side of the inverter circuit 2, that is, between the inverter circuit 2 and the ground, to measure current flowing in the inverter circuit 2, and includes a shunt resistor 11 and an amplification circuit 12. The current measuring unit 10 may be connected to a power source supply side of the inverter circuit 2, that is, between the inverter circuit 2 and the power source 3.

The shunt resistor 11 is connected to the ground side of the inverter circuit 2 in series, and generates a voltage drop when the current flows in the inverter circuit 2. A resistance value of the shunt resistor 11 is decided based on the current flowing in the inverter circuit 2 or a circuit design.

The amplification circuit 12 is a differential amplification circuit that amplifies a voltage difference between both ends of the shunt resistor 11 with a predetermined amplification factor. The amplification circuit 12 is connected to the shunt resistor 11 in parallel, amplifies the voltage difference between the both ends of the shunt resistor 11 with the predetermined amplification factor, and then, outputs the amplified voltage to the control unit 30 (to be described later). The amplification factor is decided based on the current flowing in the inverter circuit 2 or the circuit design. Furthermore, as the amplification circuit 12, an operational amplifier may be used.

The test voltage applying unit 20 applies a predetermined first test voltage to the current measuring unit 10, and includes a battery 21 and a switch 22. The battery 21 is a power source that supplies the first DC test voltage to the current measuring unit 10, and is connected to the current measuring unit 10 through the switch 22. The battery 21 may be provided separately from the power source 3 that drives the inverter circuit 2, or the power source 3 may be used as the battery 21. The switch 22 is a switch controlled by the control unit 30 (to be described later). The first test voltage is applied to the current measuring unit only when the switch is turned on. As the switch 22, a relay, a transistor or the like may be used.

The control unit 30 controls the inverter circuit 2, determines whether the current measuring unit 10 has failed or not based on the first test voltage applied to the current measuring unit 10 by the test voltage applying unit 20, applies a predetermined second test voltage to the inverter circuit 2, and determines whether the inverter circuit 2 and a coil of the motor 5 (hereinafter, referred to as a "motor coil") have failed or not based on the applied second test voltage. As the control unit 30, a microcomputer may be used. Furthermore, the control of the inverter circuit 2 and the determination of the fault in the inverter circuit 2 and the motor coil may be performed by separate microcomputers.

Next, an operation of the fault detection device 1 with such a configuration will be described. First, the operation until the fault detection device 1 according to the present embodiment detects the fault in the current measuring unit 10 that measures the current flowing in the inverter circuit 2 will be described with reference to FIGS. 1 and 2.

Figure 2:
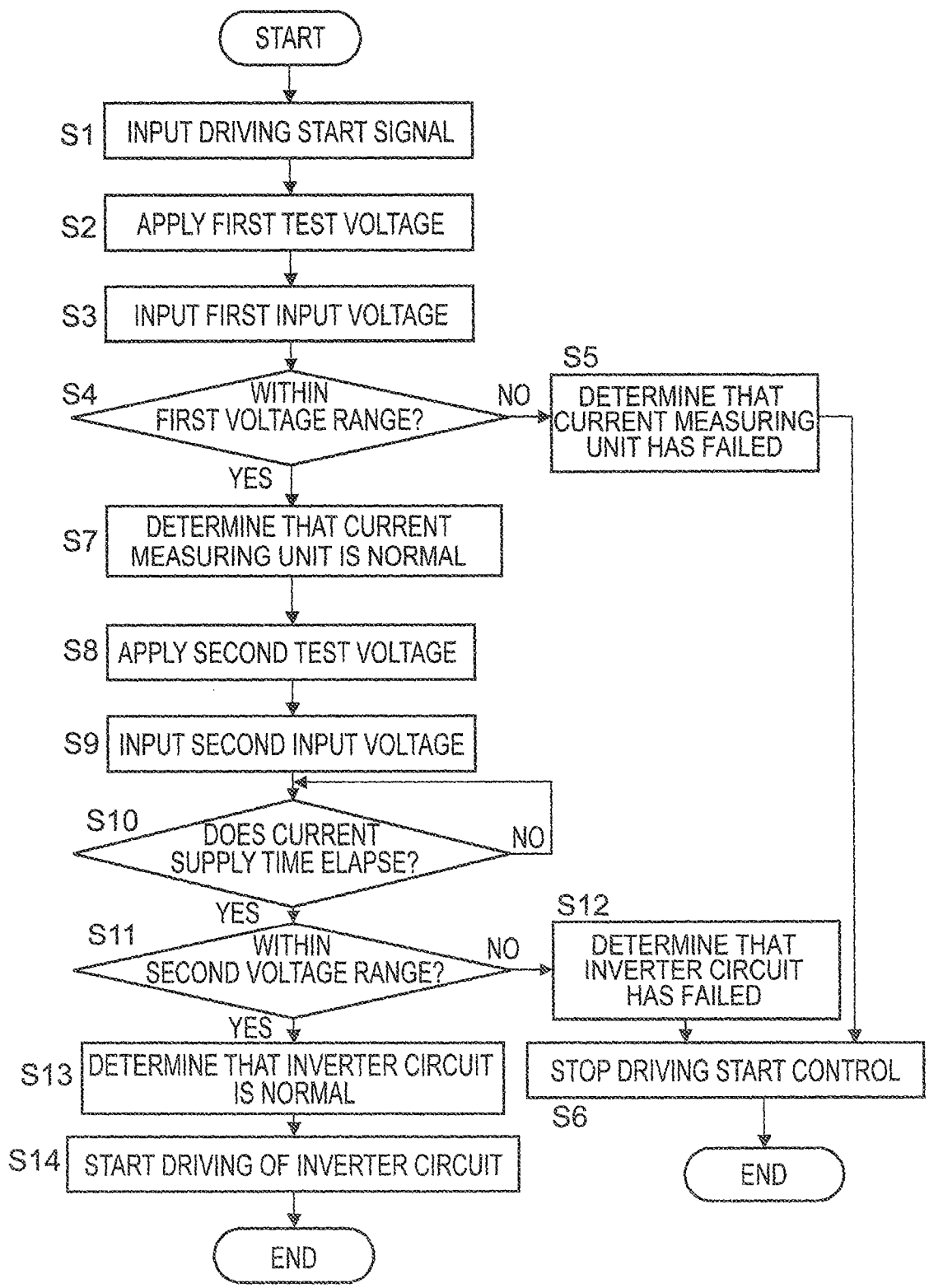
FIG. 2 is a flowchart illustrating an operation of the fault detection device for the inverter system.

First, in FIG. 1, if the driving start switch 4 is turned on in a manual manner or under an electronic control, the driving start signal Sig1 is output by the driving start switch 4 and is input to the control unit 30 (step S1 in FIG. 2). If the driving start signal Sig1 is input, the control unit 30 outputs a control signal Sig2 to the switch 22 to turn on the switch 22. If the switch 22 is turned on, the first test voltage is applied to the current measuring unit 10 from the battery 21 (step S2). Furthermore, as the current flows in the current measuring unit 10, a voltage drop occurs in the shunt resistor 11, the voltage difference between the both ends of the shunt resistor 11 is amplified by the amplification circuit 12, and the amplified first test voltage (hereinafter, referred to as a "first input voltage") is output to be input to the control unit 30 (step S3).

If the first input voltage is input, the control unit 30 compares the first input voltage with a voltage range (hereinafter, referred to as a "first voltage range") that is determined in advance based on the first test voltage (step S4). If the first input voltage is beyond the first voltage range, that is, if the first input voltage is greater than an upper limit value of the range or less than a lower limit value of the range, the procedure proceeds to "No" in the flowchart in FIG. 2, and the control unit 30 determines that the current measuring unit 10 has failed (step S5). Furthermore, the control unit 30 outputs a control signal Sig3 to turn off the switch 22, stops the application of the first test voltage, and stops the driving start control of the inverter circuit 2 (step S6).

Conversely, in step S4, if the first input voltage is within the first voltage range, that is, if the first input voltage is less than or equal to the upper limit value and greater than or equal to the lower limit value of the range, the procedure proceeds to "Yes" in the flowchart in FIG. 2, and the control unit 30 determines that the current measuring unit 10 is normal (step S7). Furthermore, the control unit 30 outputs the control signal Sig3 to turn off the switch 22, and stops the application of the first test voltage. The first voltage range is stored in a storage unit provided inside or outside the control unit 30.

With the above-described configuration and operation, the control unit 30 can determine whether the current measuring unit 10 has failed or not based on the first test voltage applied to the current measuring unit 10 by the test voltage applying unit 20. Accordingly, before detecting the fault in the inverter circuit 2, it is possible to detect the fault in the current measuring unit 10. Furthermore, since only one current measuring unit 10 is provided, the circuit is simplified. Thus, it is possible to easily manufacture the circuit. Furthermore, the number of components decreases, and thus, it is possible to manufacture the circuit at low cost. In particular, since only one expensive amplification circuit 12 for detecting a very small voltage drop in the shunt resistor 11 is required, it is possible to manufacture the circuit at low cost. Furthermore, even when the first input voltage is greater than the upper limit value of the first voltage range or even when the voltage is less than the lower limit value thereof, the control unit 30 can perform the determination as to whether the current measuring unit 10 has failed, and thus, it is possible to reliably detect the fault in the current measuring unit 10.

Next, the operation until the fault detection device 1 according to the invention detects the fault in the inverter circuit 2 will be described with reference to FIGS. 1 and 2.

In step S7 in FIG. 2, if the control unit 30 determines that the current measuring unit 10 is normal, the control unit 30 outputs a control signal Sig4 to the inverter circuit 2 and applies the second test voltage to the inverter circuit 2 (step S8). Then, the current flowing in the inverter circuit 2 is measured by the current measuring unit 10, and a voltage drop occurs in the shunt resistor 11 by the flow of the current. Then, a voltage difference between both ends of the shunt resistor 11 is amplified by the amplification circuit 12, and the amplified second test voltage (hereinafter, referred to as a "second input voltage") is output to be input to the control unit 30 (step S9).

The control unit 30 determines whether a predetermined time (hereinafter, referred to as a "current supply time") elapses from the start of the application of the second test voltage (step S10), and if the time does not elapse, the procedure proceeds to "No" in the flowchart in FIG. 2. Furthermore, if the current supply time elapses, the procedure proceeds to "Yes", to compare the second input voltage that is input when the current supply time elapses with a voltage range (hereinafter, referred to as a "second voltage range") that is determined in advance based on the second test voltage (step S11). If the second input voltage is beyond the second voltage range, that is, if the second input voltage is greater than an upper limit value of the range or less than a lower limit value of the range, the procedure proceeds to "No" in the flowchart in FIG. 2, and the control unit 30 determines that the inverter circuit 2 has failed (step S12). Furthermore, the control unit 30 outputs a control signal Sig5 to stop the application of the second test voltage, and stops the driving start control of the inverter circuit 2 (step S6).

Conversely, in step S11, if the second input voltage is within the second voltage range, that is, if the second input voltage is less than or equal to the upper limit value and greater than or equal to the lower limit value of the range, the procedure proceeds to "Yes" in the flowchart in FIG. 2, and the control unit 30 determines that the inverter circuit 2 is normal (step S13). Then, the control unit 30 outputs a control signal Sig6 to start the driving of the inverter circuit 2 (step S14). The second voltage range and the current supply time are stored in the storage unit provided inside or outside the control unit 30.

With the above-described configuration and operation, even when the second input voltage is greater than the upper limit value of the second voltage range or even when the voltage is less than the lower limit value thereof, the control unit 30 can perform the determination as to whether the inverter circuit 2 has failed or not. Accordingly, it is possible to reliably detect the fault in the inverter circuit 2. Furthermore, since the control unit 30 can determine whether the inverter circuit 2 has failed or not when the current supply time of the second test voltage elapses, it is possible to properly decide the second voltage range by determining the current supply time in advance. Thus, it is possible to accurately determine the fault in the inverter circuit 2.

Furthermore, an operation when the fault detection device 1 having the above-described configuration is used in the inverter circuit 2 for driving the motor will be described with reference to FIGS. 3 to 6.

Figure 3:
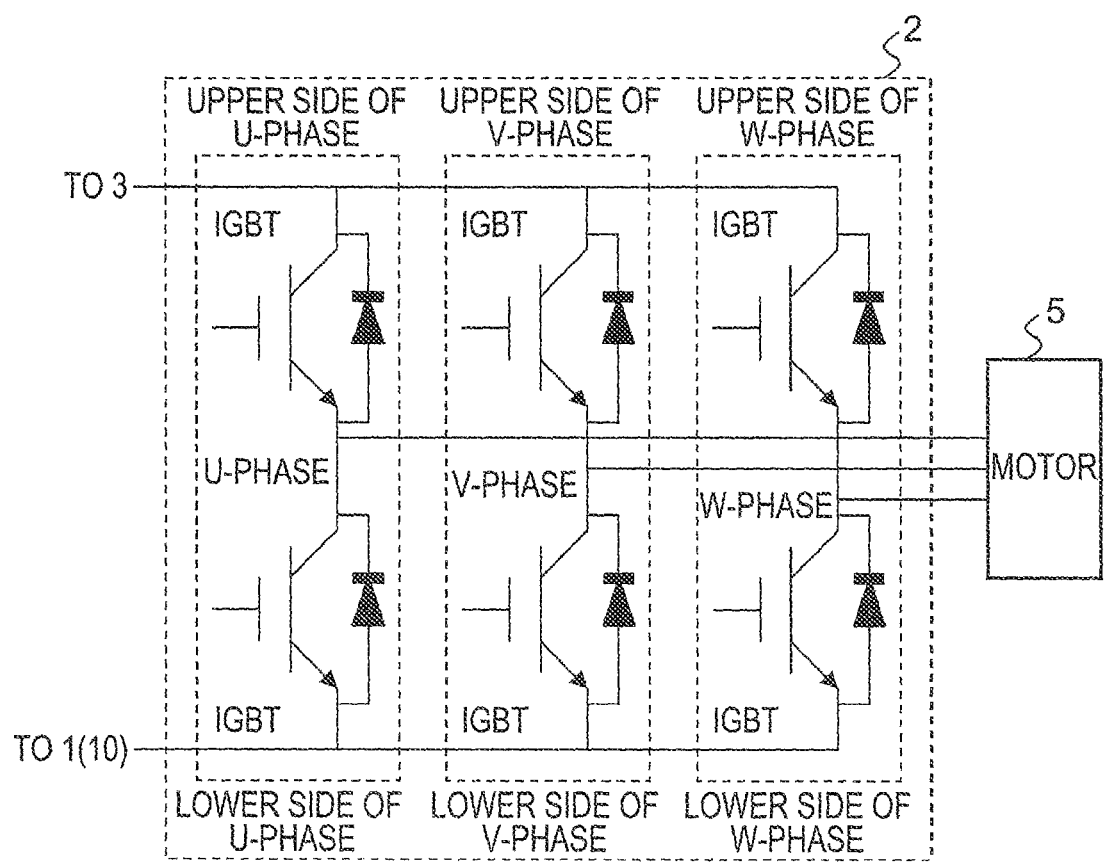
FIG. 3 is a schematic diagram of a motor-driving inverter circuit to which the fault detection device for the inverter system is connected.

FIG. 3 is a schematic diagram illustrating the inverter circuit 2 for driving the motor, connected to the fault detection device 1 illustrated in FIG. 1. In FIG. 3, the motor 5 driven by the inverter circuit 2 is a three-phase brushless DC motor, and the inverter circuit 2 is a three-phase inverter circuit that includes six insulated gate bipolar transistors (hereinafter, referred to as "IGBTs"). As illustrated in FIG. 3, circuit portions that include two IGBTs that are vertically aligned and connected to each other are respectively referred to as a U-phase, a V-phase and a W-phase from the left side in FIG. 3, and coils of the motor 5 driven by the respective phases are respectively referred to as a U-phase coil, a V-phase coil and a W-phase coil (not illustrated).

The operation of the fault detection device 1 has been described above, but when the motor 5 is driven by the inverter circuit 2, the voltage range based on the second test voltage used to detect the fault in the inverter circuit 2 may be decided based on the current supply time of the second test voltage, as follows.

When the current flowing in the inverter circuit 2 is I, the second test voltage is V, inductance of the coil is L, and the time that elapses from the start of the current supply to the inverter circuit 2 is t, a current according to a formula of I=∫V/Ldt flows in the inverter circuit 2. For example, when the second test voltage is 100 V and the coil inductance is 1 mH (assuming that wire wound resistance of the coil is small), when the current flows through the upper side of the U-phase and the lower side of the V-phase of the inverter circuit 2, and when 100 μsec elapses from the start of the current supply to the inverter circuit 2, a current of 10 A flows in the inverter circuit 2. Accordingly, it is possible to decide the second voltage range based on the current of 10 A, the resistance value of the shunt resistor 11, and the amplification factor of the amplification circuit 12.

[Short Circuit Detection of Inverter Circuit 2]

After it is determined that the current measuring unit 10 illustrated in FIG. 1 is normal, when the fault in the inverter circuit 2 is detected, by sequentially supplying current to six IGBTs, it is possible to detect which IGBT a short circuit occurs in. FIG. 4 is a table in which, with respect to IGBTs supplied with current in detection of the short circuit of the inverter circuit 2 in FIG. 3, a current determination result and a short circuit detection result corresponding to the determination result for each IGBT in the control unit 30 are collectively shown.

In FIG. 4, the IGBT on the lower side of the U-phase is supplied with current (applied with the second test voltage) by the control unit 30 illustrated in FIG. 1, and the current flowing in the IGBT is measured by the current measuring unit 10. Here, when the control unit 30 determines that the measured current is overcurrent, the short circuit on upper side of the U-phase is detected. Furthermore, when it is determined that the measured current is within a predetermined current range (the second input voltage is within the second voltage range), the control unit 30 determines that the IGBT on the upper side of the U-phase is normal, and stops the current supply.

When it is determined that the IGBT on the upper side of the U-phase is normal, the control unit 30 supplies current (applies the second test voltage) to the IGBT on the lower side of the V-phase. Furthermore, the current flowing in the IGBT is measured by the current measuring unit 10, and then, the control unit 30 determines whether the measured current is overcurrent. When it is determined that the current is the overcurrent, the short circuit on upper side of the V-phase is detected. Furthermore, when it is determined that the current is within the predetermined current range (the second input voltage is within the second voltage range), the control unit 30 determines that the IGBT on the upper side of the V-phase is normal, and stops the current supply.

By sequentially performing the above operation for all six IGBTs, it is possible to detect the short circuit of each IGBT in the inverter circuit 2. In FIG. 4, the current supply to the respective IGBTs is performed in the order of the lower side of the U-phase, the lower side of the V-phase, the lower side of the W-phase, the upper side of the U-phase, the upper side of the V-phase, and the upper side of the W-phase, but any order may be employed. By supplying current to the IGBT on the upper side of each phase in the inverter circuit 2, it is possible to detect the short circuit of the IGBT on the lower side of each phase, and by supplying current to the IGBT on the lower side of each phase in the inverter circuit 2, it is possible to detect the short circuit of the IGBT on the upper side of each phase.

[Short Circuit Detection of Inverter Circuit 2 and Coil of Motor 5]

Next, after it is determined that the current measuring unit 10 illustrated in FIG. 1 is normal, when the detection of fault in the inverter circuit 2 is performed, by sequentially supplying current through six IGBTs, it is possible to detect a short circuit in each IGBT, a short circuit between the IGBTs and a short circuit of the coil in each phase of the motor 5. FIG. 5 is a table in which, with respect to pairs of IGBTs supplied with current in detection of a short circuit of the inverter circuit 2 and the coil in each phase of the motor 5 in FIG. 3, a current determination result and a short circuit detection result corresponding to the determination result for each pair of the IGBTs obtained by the control unit 30 are collectively shown.

In FIG. 5, for example, the current supply is sequentially performed (the second test voltage is applied) to the IGBTs on the upper side of the U-phase and the lower side of the V-phase in the inverter circuit 2, the IGBTs on the upper side of the U-phase and the lower side of the W-phase, the IGBTs on the upper side of the V-phase and the lower side of the U-phase, the IGBTs on the upper side of the V-phase and the lower side of the W-phase, the IGBTs on the upper side of the W-phase and the lower side of the U-phase, and the IGBTs on the upper side of the W-phase and the lower side of the V-phase, by the control unit 30. Then, in each case, a current flowing through each pair of the IGBTs is measured by the current measuring unit 10, and the determination is performed by the control unit 30. Here, when it is determined that the currents flowing through the IGBTs on the upper side of the U-phase and the lower side of the V-phase, the IGBTs on the upper side of the U-phase and the lower side of the W-phase, the IGBTs on the upper side of the V-phase and the lower side of the U-phase, and the IGBTs on the upper side of the W-phase and the lower side of the U-phase are approximately twice a predetermined current (the second input voltage is approximately twice the second voltage range), and when it is determined that the currents flowing through the IBGTs on the upper side of the V-phase and the lower side of the W-phase, and the IGBTs on the upper side of the W-phase and the lower side of the V-phase are within a predetermined current range (the second input voltage is within the second voltage range), the short circuit of the coil in the U-phase of the motor 5 is detected. Here, the current may be supplied in any order. Furthermore, the "normal" in the current supply result in FIG. 5 indicates that the current flowing through the respective pair of the IGBTs is within the predetermined current range (the second input voltage is within the second voltage range).

[Disconnection Detection of Inverter Circuit 2 and Coil of Motor 5]

Next, after it is determined that the current measuring unit 10 illustrated in FIG. 1 is normal, when the detection of fault in the inverter circuit 2 is performed, by sequentially supplying current through six IGBTs, it is possible to detect disconnection in each IGBT and disconnection of the coil in each phase of the motor 5. FIG. 6 is a table in which, with respect to pairs of IGBTs supplied with current in detection of disconnection of the inverter circuit 2 and the coil in each phase of the motor 5 in FIG. 3, a current supply determination result and a disconnection detection result corresponding to the determination result for each pair of the IGBTs obtained by the control unit 30 are collectively shown.

In FIG. 6, for example, the current supply is sequentially performed (the second test voltage is applied) to the IGBTs on the upper side of the U-phase and the lower side of the V-phase in the inverter circuit 2, the IGBTs on the upper side of the U-phase and the lower side of the W-phase, the IGBTs on the upper side of the V-phase and the lower side of the U-phase, the IGBTs on the upper side of the V-phase and the lower side of the W-phase, the IGBTs on the upper side of the W-phase and the lower side of the U-phase, and the IGBTs on the upper side of the W-phase and the lower side of the V-phase, by the control unit 30. Then, in each case, a current flowing through each pair of the IGBTs is measured by the current measuring unit 10, and the determination is performed by the control unit 30. Here, when it is determined that the current does not flow through the IGBTs on the upper side of the U-phase and the lower side of the V-phase, the IGBTs on the upper side of the U-phase and the lower side of the W-phase, the IGBTs on the upper side of the V-phase and the lower side of the U-phase, and the IGBTs on the upper side of the W-phase and the lower side of the U-phase (the second input voltage is 0 V), and when it is determined that the current flows through the IBGTs on the upper side of the V-phase and the lower side of the W-phase, and the IGBTs on the upper side of the W-phase and the lower side of the V-phase (the second input voltage >0 V), the disconnection of the coil in the U-phase of the motor 5 is detected. Here, the current may be supplied in any order. Furthermore, the "current supply" in the current supply result in FIG. 6 represents that the current flows through the respective pair of the IGBTs, which is irrespective of whether the current is overcurrent.

The above-described detection methods may be individually used, or a combination of two or more detection methods may be used.

The invention claimed is:

1. A fault detection device for an inverter system, that detects a fault in the inverter system, the inverter system including:
   an inverter circuit which converts input DC power into AC power;
   a motor which is driven by the inverter circuit;
   a current measuring unit that measures current flowing in the inverter circuit;
   a test voltage applying unit which applies a predetermined first test voltage to the current measuring unit when a driving start signal of the inverter circuit is input, whether the current measuring unit has failed being determined based on the applied predetermined first test voltage; and
   a control unit which applies a predetermined second test voltage to the inverter circuit and the motor, whether the inverter circuit and a coil of the motor have failed being determined based on the applied second test voltage;
   wherein a driving start control of the inverter circuit is stopped upon determining failure of the current measuring unit based on the first test voltage;
   wherein the driving start control of the inverter circuit is stopped upon determining the inverter circuit and the coil of the motor have failed based on the second test voltage after determining the current measuring unit is normal; and
   wherein driving of the inverter circuit is started upon determining the inverter circuit and the coil of the motor are normal.

2. The fault detection device for an inverter system according to claim 1, wherein when the first test voltage amplified by an amplification circuit provided in the current measuring unit is greater than an upper limit value of a voltage range that is determined in advance based on the first test voltage or is less than a lower limit value thereof, the control unit determines that the current measuring unit has failed.

3. The fault detection device for an inverter system according to claim 1, wherein when the second test voltage amplified by an amplification circuit provided in the current measuring unit is greater than an upper limit value of a voltage range that is determined in advance based on the second test voltage or is less than a lower limit value thereof, the control unit determines that the inverter circuit and the coil of the motor have failed.

4. The fault detection device for an inverter system according to claim 1, wherein when a predetermined time elapses from the start of application of the second test voltage, the control unit determines whether the inverter circuit and the coil of the motor have failed.

\* \* \* \* \*